(12) United States Patent
Cabral, Jr. et al.

(10) Patent No.: US 10,388,615 B2
(45) Date of Patent: *Aug. 20, 2019

(54) ACTIVATING REACTIONS IN INTEGRATED CIRCUITS THROUGH ELECTRICAL DISCHARGE

(71) Applicant: International Business Machines Corporation, Armonk, NY (US)

(72) Inventors: Cyril Cabral, Jr., Mahopac, NY (US); Gregory M. Fritz, Ridgefield, CT (US); Conal E. Murray, Yorktown Heights, NY (US); Kenneth P. Rodbell, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/800,643

(22) Filed: Nov. 1, 2017

(65) Prior Publication Data

US 2018/0061782 A1    Mar. 1, 2018

Related U.S. Application Data

(60) Continuation of application No. 15/043,774, filed on Feb. 15, 2016, now Pat. No. 9,991,214, which is a
(Continued)

(51) Int. Cl.
*H01L 23/06* (2006.01)
*H01L 23/00* (2006.01)
(Continued)

(52) U.S. Cl.
CPC ............ *H01L 23/576* (2013.01); *H01L 23/04* (2013.01); *H01L 23/06* (2013.01); *H01L 23/345* (2013.01);
(Continued)

(58) Field of Classification Search
CPC ..................................................... H01L 23/576
(Continued)

(56) References Cited

U.S. PATENT DOCUMENTS 3,725,671 A    4/1973 Keister
5,042,386 A    8/1991 Kruse
(Continued)

FOREIGN PATENT DOCUMENTS

CN    103868417 A    6/2014
CN    104867885 A    8/2015
(Continued)

OTHER PUBLICATIONS

Cabral et al., "Energy Release Using Tunable Reactive Materials", U.S. Appl. No. 15/017,944, filed Feb. 8, 2016, pp. 1-18.
(Continued)

*Primary Examiner* — Hai L Nguyen
(74) *Attorney, Agent, or Firm* — Noah A. Sharkan; Adolph Bohnstedt; Arnold B. Bangali

(57) ABSTRACT

Embodiments of the present invention provide integrated circuits and methods for activating reactions in integrated circuits. In one embodiment, an integrated circuit is provided having reactive material capable of being activated by electrical discharge, without requiring a battery or similar external power source, to produce an exothermic reaction that erases and/or destroys one or more semiconductor devices on the integrated circuit.

10 Claims, 4 Drawing Sheets

Related U.S. Application Data division of application No. 14/534,360, filed on Nov. 6, 2014, now Pat. No. 9,431,354.

(51) Int. Cl.

| | |
|---|---|
| *H01L 31/02* | (2006.01) |
| *H01L 31/0203* | (2014.01) |
| *H01L 23/04* | (2006.01) |
| *H01L 23/34* | (2006.01) |
| *H01L 23/525* | (2006.01) |
| *H01L 25/16* | (2006.01) |

(52) U.S. Cl.
CPC .......... *H01L 23/525* (2013.01); *H01L 23/573* (2013.01); *H01L 25/16* (2013.01); *H01L 31/0203* (2013.01); *H01L 31/02019* (2013.01); *H01L 31/02021* (2013.01); *H01L 2924/0002* (2013.01)

(58) Field of Classification Search
USPC .................................................. 327/524, 525
See application file for complete search history.

(56) References Cited

U.S. PATENT DOCUMENTS

| | | | |
|---|---|---|---|
| 5,614,756 | A | 3/1997 | Forouhi |
| 5,883,429 | A | 3/1999 | Houdeau |
| 6,209,457 | B1 | 4/2001 | Kenworthy |
| 6,863,992 | B2 | 3/2005 | Weihs |
| 6,926,204 | B2 | 8/2005 | Vacherand |
| 7,143,568 | B2 | 12/2006 | Heerden |
| 7,469,640 | B2 | 12/2008 | Nielson |
| 7,489,013 | B1 | 2/2009 | Chubin |
| 7,535,105 | B2 | 5/2009 | Voldman |
| 7,561,059 | B2 | 7/2009 | Diluoffo et al. |
| 7,644,854 | B1 | 1/2010 | Holmes |
| 7,690,308 | B2 | 4/2010 | Nielson |
| 7,880,248 | B1 | 2/2011 | Pham |
| 7,896,988 | B2 | 3/2011 | Mohler |
| 7,951,247 | B2 | 5/2011 | Barbee |
| 8,105,859 | B2 | 1/2012 | Breitwisch |
| 8,149,012 | B2 | 4/2012 | Lazaravich et al. |
| 8,332,661 | B2 | 12/2012 | Mostovych |
| 8,495,382 | B2 | 7/2013 | Johnson |
| 8,581,617 | B2 | 11/2013 | Reese |
| 8,623,156 | B1 | 1/2014 | Haines |
| 8,669,806 | B2 | 3/2014 | Rountree |
| 8,816,717 | B2 | 8/2014 | Fritz |
| 8,861,728 | B2 * | 10/2014 | Chu .................... H01L 27/2436 257/E23.002 |
| 8,987,052 | B2 | 3/2015 | Smith |
| 9,056,426 | B2 | 6/2015 | Syassen |
| 9,431,354 | B2 * | 8/2016 | Cabral, Jr. ............ H01L 23/576 |
| 9,553,056 | B1 | 1/2017 | Afzali-Ardakani |
| 9,586,857 | B2 | 3/2017 | Cabral, Jr. et al. |
| 9,738,560 | B2 | 8/2017 | Cabral, Jr. et al. |
| 9,991,214 | B2 * | 6/2018 | Cabral, Jr. ............ H01L 23/576 |
| 2007/0235500 | A1 | 10/2007 | Suh et al. |
| 2007/0257364 | A1 | 11/2007 | Van Heerden et al. |
| 2008/0307992 | A1 | 12/2008 | Mohler |
| 2010/0012323 | A1 | 1/2010 | Holmes |
| 2011/0127314 | A1 | 6/2011 | Heinrich et al. |
| 2013/0250662 | A1 | 9/2013 | Katti |
| 2014/0042627 | A1 | 2/2014 | Edelstein |
| 2014/0103957 | A1 | 4/2014 | Fritz |
| 2014/0210110 | A1 | 7/2014 | Smith |
| 2015/0060898 | A1 | 3/2015 | Van Heerden |
| 2016/0133581 | A1 | 5/2016 | Cabral, Jr. |
| 2016/0163658 | A1 | 6/2016 | Cabral, Jr. |
| 2016/0300802 | A1 * | 10/2016 | Cabral, Jr. ............ H01L 23/576 |

FOREIGN PATENT DOCUMENTS

| | | |
|---|---|---|
| RU | 2455728 C1 | 7/2012 |
| RU | 2455729 C1 | 7/2012 |
| RU | 2527241 C1 | 8/2014 |
| WO | WO-2008051300 A2 | 5/2008 |
| WO | WO-2016033123 A1 | 3/2016 |

OTHER PUBLICATIONS

Cabral et al., "Energy Release Using Tunable Reactive Materials", U.S. Appl. No. 15/198709, filed Jun. 30, 2016, pp. 1-27.

Cabral et al., "Fragmenting Computer Chips", U.S. Appl. No. 15/722,219, filed Oct. 2, 2017, pp. 1-27.

Cabral et al., "Fragmenting Computer Chips", U.S. Appl. No. 15/222,056, filed Jul. 28, 2016, pp. 1-52.

Cabral et al., "Triggering Fragmenting Substrates", U.S. Appl. No. 62/080,586, filed Nov. 17, 2014, 9 pages.

Fischer, S.H. et al. "A Survey of Combustible Metals, Thermites, and Intermetallics for Pyrotechnic Applications," presented at the 32nd AIAA/ASME/SAE/ASEE Joint Propulsion Conference (1996), pp. 1-13.

Schuegraf et al., "Reliability of thin SiO2", IOP Science, Semiconductor Science Technology, vol. 9, 989, No. 5, May 1994, doi:10.1088/0268-1242/9/5/002, 1 page, <http://iopscience.iop.org/0268-1242/9/5/002>.

Wallash et al., "Electrical breakdown and ESD phenomena for devices with nanometer-to-micron gaps", SPIE Proceedings, vol. 4980, Reliability, Testing, and Characterization of MEMS/MOEMS II, 87 (Jan. 25, 2003), doi:10.1117/12.478191, 10 pages, Downloaded From: <http://proceedings.spiedigitallibrary.org/ on Nov. 5, 2014, Terms of Use: http://spiedl.org/terms>.

IBM Appendix P, "List of IBM Patents or Patent Applications to be Treated as Related", Dated Nov. 1, 2017, 2 pages.

* cited by examiner

ACTIVATING REACTIONS IN INTEGRATED CIRCUITS THROUGH ELECTRICAL DISCHARGE

CROSS REFERENCE

The present application is a continuation of U.S. patent application Ser. No. 15/043,774(U.S. Pat. No. 9,991,214), filed on Feb. 15, 2016, which is a divisional of patent application Ser. No. 14/534,360 (U.S. Pat. No. 9,431,354), filed on Nov. 6, 2014.

FIELD OF THE INVENTION

The present invention relates generally to the field of integrated circuits, and more particularly to activating reactions in tamper-resistant integrated circuits through electrical discharge.

BACKGROUND OF THE INVENTION

The fabrication of semiconductor devices involves forming electronic components in and on semiconductor substrates, such as silicon wafers. These electronic components may include one or more conductive layers, one or more insulation layers, and doped regions formed by implanting various dopants into portions of a semiconductor substrate to achieve specific electrical properties. Semiconductor devices include field-effect transistors (FETs), resistors, capacitors, and the like, with intermediate and overlying metallization patterns at varying levels, separated by dielectric materials, which interconnect the semiconductor devices to form integrated circuits.

In some cases, manufacturers of integrated circuits may wish to protect critical circuit elements from being tampered with or reverse-engineered. For example, manufacturers might employ one or more anti-tamper mechanisms to erase or destroy semiconductor devices and/or information stored thereon in the event of tampering.

SUMMARY

According to one aspect of the present invention, an integrated circuit is provided comprising: a semiconductor build; a first dielectric layer deposited onto the semiconductor build; reactive material deposited into a trench in the first dielectric layer; a barrier disposed atop the reactive material, wherein the barrier is configured to undergo dielectric breakdown upon application of voltage to the barrier; and metallization disposed atop the barrier, wherein at least a portion of the metallization is configured to carry electrical current to the barrier.

According to another aspect of the present invention, a method for activating a reaction in an integrated circuit is provided, comprising: providing an integrated circuit comprising: a semiconductor build; a first dielectric layer deposited onto the semiconductor build; reactive material deposited into a trench in the first dielectric layer; a barrier disposed atop the reactive material, wherein the barrier is configured to undergo dielectric breakdown upon application of voltage to the barrier; and metallization disposed atop the barrier, wherein at least a portion of the metallization is configured to carry electrical current to the barrier; applying voltage to the barrier to cause dielectric breakdown of the barrier and pass current through the reactive material; and activating an exothermic reaction of the reactive material using the current passed through the reactive material.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Embodiments of the present invention provide integrated circuits and methods for making the same that include a reactive material capable of being activated by electrical discharge, without requiring a battery or similar external power source. Embodiments of the present invention further provide methods and packaging that can be used in conjunction with integrated circuits to activate reactive material in the integrated circuits upon tampering with the packaging.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, and some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such a feature, structure, or characteristic in connection with other embodiments whether or not explicitly described.

FIGS. 1A through 1G depict phases of fabrication of tamper-resistant integrated circuit 100, in accordance with an embodiment of the present invention. Tamper-resistant integrated circuit 100 comprises semiconductor build 102. Semiconductor build 102 represents front-end-of-line (FEOL) and/or middle-of-line (MOL) and/or back-end-of-line (BEOL) components, such as a plurality of transistors and metallization built onto a semiconductor substrate of silicon, single crystal silicon, polycrystalline silicon, silicon germanium, germanium, polycrystalline silicon germanium, and/or compound semiconductor substrates, such as type III/V semiconductor substrates.

Figure 1A:
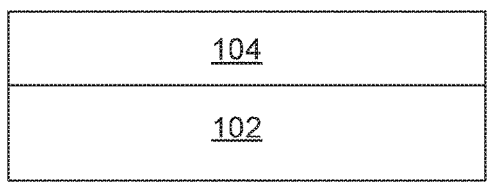
FIGS. 1A through 1G depict phases of fabrication of a tamper-resistant integrated circuit, in accordance with an embodiment of the present invention.

As shown in FIG. 1A, dielectric layer 104 is deposited onto semiconductor build 102. Dielectric layer 104 may be comprised of any suitable materials, such as silicon dioxide ($SiO_2$) and/or a low-k organosilicate glass, and may be deposited onto semiconductor build 102 using any suitable techniques known in the art, such as atomic layer deposition (ALD) and/or chemical vapor deposition (CVD).

Figure 1B:
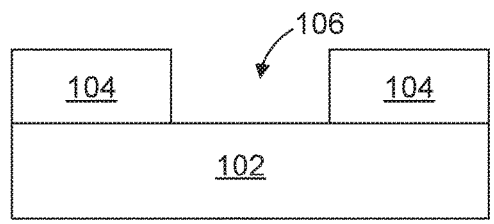
Figure 1C:
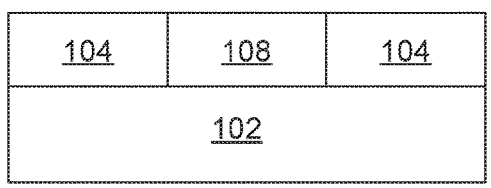

As shown in FIG. 1B, trench 106 is etched into dielectric layer 104 and, as shown in FIG. 1C, reactive material 108 is deposited into trench 106 and planarized. Reactive material 108 comprises a multilayer material that can be activated by electrical discharge to produce an exothermic reaction capable of erasing and/or destroying semiconductor devices (e.g., FETs and nonvolatile memory elements) and/or information stored thereon located in semiconductor build 102, without requiring a battery or similar external power source. In a preferred embodiment, reactive material 108 can be activated by applying power within in a range of 10 nanowatts to 10 microwatts, such as power generated from electrostatic discharge. In this embodiment, trench 106 and reactive material 108 are disposed within sufficient proximity of one or more areas of semiconductor build 102 containing semiconductor devices to be erased and/or destroyed, such that energy generated by the exothermic reaction of reactive material 108 can erase and/or destroy those semiconductor devices.

In this embodiment, reactive material 108 comprises multiple, alternating layers of metals, such as, for example, palladium and aluminum. In other embodiments, other combinations of metals or materials known in the art can be used, such as aluminum, chromium, copper, nickel, palladium, platinum, titanium, tantalum and silicon. Trench 106 and reactive material 108 can be formed by any suitable etching and deposition techniques known in the art. For example, after etching trench 106, a lift-off process can be used in which photoresist is deposited and patterned on semiconductor build 102; alternating layers of metals comprising reactive material 108 are blanket deposited onto the photoresist and into trench 106, after which the photoresist (along with reactive material 108 deposited thereon) is washed away with solvent, leaving reactive material 108 deposited in trench 106.

Figure 1D:
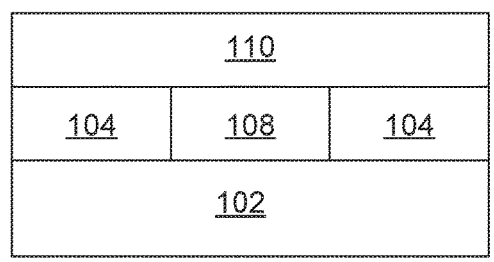

As shown in FIG. 1D, dielectric layer 110 is deposited over dielectric layer 104 and reactive material 108. Again, as discussed with regard to dielectric layer 104, dielectric layer 110 may be comprised of any suitable dielectric materials and may be deposited via any suitable techniques known in the art.

Figure 1E:
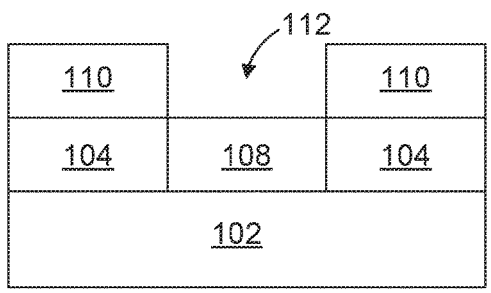

As shown in FIG. 1E, via 112 is etched into dielectric layer 110 such that via 112 lands on reactive material 108. Via 112 may be of any suitable dimensions. In one embodiment, via 112 is approximately 100 nm by 100 nm in size.

Figure 1F:
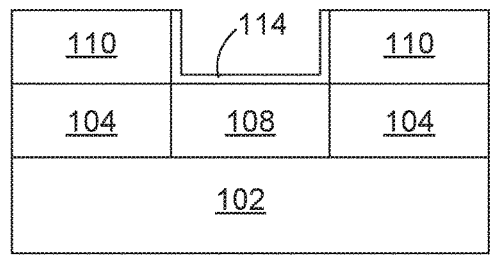

As shown in FIG. 1F, dielectric barrier layer 114 is deposited into via 112. In this embodiment, dielectric barrier layer 114 is an ultrathin dielectric layer relative to thicknesses of dielectric layers 104 and 110, and dielectric barrier layer 114 has a thickness that is small enough such that, upon application of power within a range of 10 nanowatts to 10 microwatts, dielectric barrier layer 114 will undergo dielectric breakdown, causing a sufficient amount of current to discharge into reactive material 108 to activate reactive material 108. Preferably, dielectric barrier layer 114 has a thickness less than 10 nm. More preferably, dielectric barrier layer 114 has a thickness from 1 nm to 5 nm. In this embodiment, dielectric barrier layer 114 is comprised of silicon oxide, silicon nitride, diamond-like carbon, aluminum oxide, hafnium(IV) oxide, or another suitable high-k dielectric material. As shown in FIG. 1F, dielectric barrier layer 114 is deposited into via 112 such that dielectric barrier layer 114 is formed on the sidewalls of via 112 (i.e., defined by dielectric layer 110) and the surface of reactive material 108 exposed by via 112. Dielectric barrier layer 114 can be formed using any suitably conformal deposition technique known in the art, such as CVD or ALD.

Figure 1G:
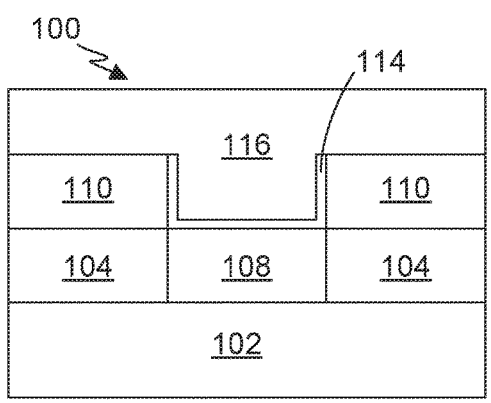

As shown in FIG. 1G, metallization 116 is built on dielectric layer 110 and dielectric barrier layer 114. Metallization 116 comprises back-end-of-line (BEOL) components and metallization interconnecting semiconductor devices. In this embodiment, metallization 116 includes a diffusion barrier layer (e.g., formed of tantalum, tantalum nitride, titanium, titanium nitride, cobalt, ruthenium, etc.) deposited over dielectric layer 110 and dielectric barrier layer 114 in via 112, and a metal interconnect (e.g., formed of copper, aluminum, tungsten, etc.) deposited over the diffusion barrier layer in via 112. The diffusion barrier layer prevents diffusion of metal from the metal interconnect into dielectric layer 110 and dielectric barrier layer 114. Metallization 116 further includes a contact electrically coupled to the metal interconnect, such that power applied to the contact can be transmitted to dielectric barrier layer 114, causing dielectric breakdown, which in turn causes a sufficient amount of current to discharge into reactive material 108 to activate reactive material 108. Accordingly, in this embodiment, dielectric barrier layer 114 serves as a barrier separating metallization 116 and reactive material 108, the dielectric breakdown of which allows current to flow through reactive material 108 and activate the exothermic reaction of reactive material 108. In this embodiment, metallization in semiconductor build 102 is used to complete the circuit from metallization 116 and through reactive material 108. In other embodiments, a portion of metallization 116 can be disposed below reactive material 108 to complete the circuit through reactive material 108.

Although only one region of reactive material 108 is shown in FIGS. 1A-1G, it will be appreciated that any number of regions of reactive material 108 and dielectric barrier layer 114 can be formed as needed to facilitate erasing and/or destroying any desired number of semiconductor devices located on semiconductor build 102.

FIGS. 2A through 2I depict phases of fabrication of tamper-resistant integrated circuit 200, in accordance with an embodiment of the present invention. In this embodiment, phases of fabrication of tamper-resistant integrated circuit 100 depicted in FIGS. 2A through 2E are the same as those for tamper-resistant integrated circuit 100 depicted in FIGS. 1A through 1E, where like elements have reference numerals increased by a factor of 100, and will, therefore, not be separately discussed.

Figure 2A:
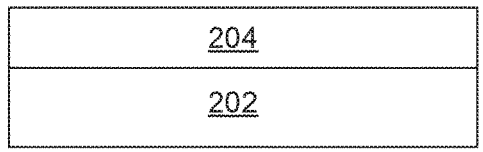
FIGS. 2A through 2I depict phases of fabrication of a tamper-resistant integrated circuit, in accordance with another embodiment of the present invention.
Figure 2B:
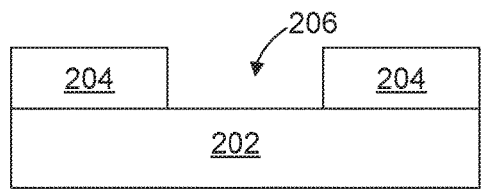
Figure 2C:
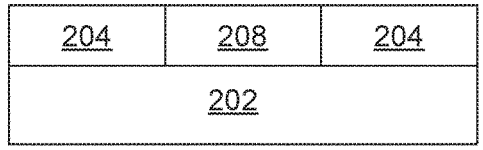
Figure 2D:
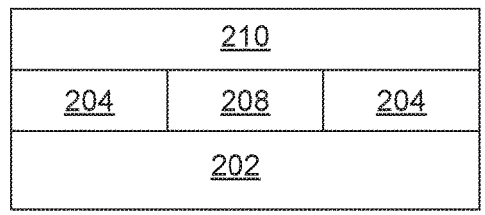
Figure 2E:
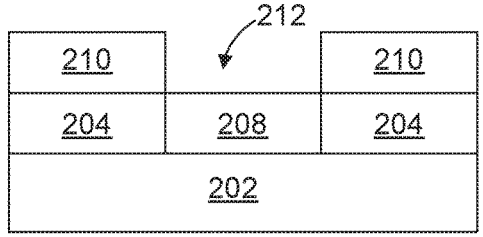
Figure 2F:
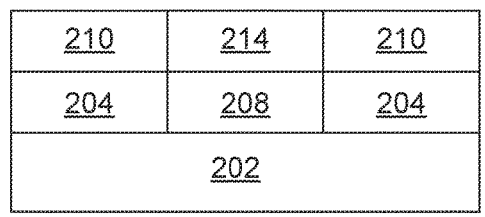

As shown in FIG. 2F, dielectric layer 214 is deposited into via 212 and is planarized. In this embodiment, dielectric layer 214 comprises a low-k dielectric material such as silicon dioxide and/or a low-k organosilicate glass, and may be deposited using any suitable technique known in the art (e.g., CVD or AVD).

Figure 2G:
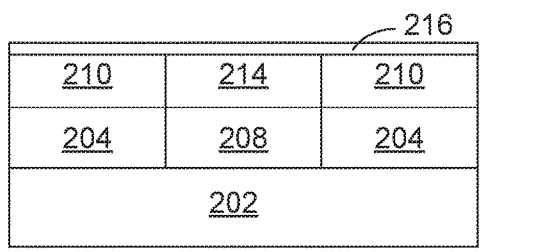

As shown in FIG. 2G, porous diblock copolymer layer 216 is deposited over dielectric layer 210 and dielectric layer 214. In this embodiment, porous diblock copolymer layer 216 is comprised of polystyrene and poly(methyl methacrylate) (i.e., poly(styrene-block-methyl methacrylate), or PS-PMMA). In other embodiments, any suitable porous diblock copolymer can be used that is permeable to etchant used to remove dielectric layer 214.

Figure 2H:
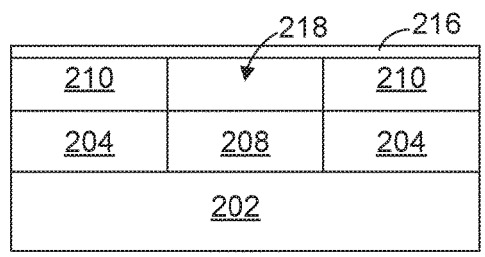

As shown in FIG. 2H, etchant is permeated through diblock copolymer layer 216 to remove dielectric layer 214, producing gap 218 bounded by diblock copolymer layer 216, dielectric layer 210, and reactive material 208. Gap 218 can be occupied by air, other gases, or a vacuum.

Figure 2I:
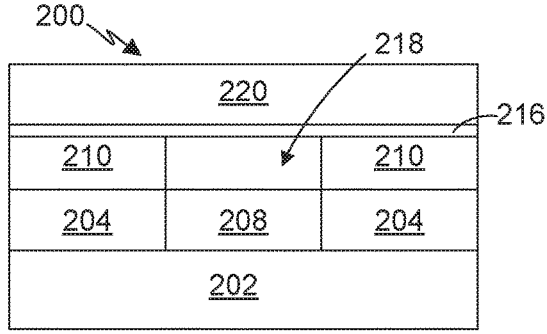

As shown in FIG. 2I, metallization 220 is built on diblock copolymer layer 216. Metallization 220 comprises back-end-of-line (BEOL) components and metallization interconnecting semiconductor devices. In this embodiment, metallization 220 includes a metal interconnect (e.g., formed of copper, aluminum, tungsten, etc.) deposited over diblock copolymer layer 216 above gap 218. Metallization 220 further includes a contact electrically coupled to the metal interconnect, such that power applied to the contact can be transmitted to diblock copolymer layer 216 above gap 218, causing dielectric breakdown within gap 218, which in turn causes a sufficient amount of current to arc across gap 218 and discharge into reactive material 208 to activate reactive material 208. Accordingly, in this embodiment, gap 218 serves as a barrier separating metallization 220 and reactive material 208, the dielectric breakdown of which allows current to flow through reactive material 208 and activate the exothermic reaction of reactive material 208. In this embodiment, metallization in semiconductor build 202 is used to complete the circuit from metallization 218 and through reactive material 208. In other embodiments, a portion of metallization 220 can be disposed below reactive material 208 to complete the circuit through reactive material 208.

Again, although only one region of reactive material 208 is shown in FIGS. 2A-2I, it will be appreciated that any number of regions of reactive material 208 and gaps 218 can be formed as needed to facilitate erasing and/or destroying any desired number of semiconductor devices located on semiconductor build 202.

The resulting tamper-resistant integrated circuits 100 and 200 can be distributed by the fabricator in raw wafer form (that is, as a single wafer that has multiple unpackaged chips), as a bare die, or in a packaged form. In the latter case, tamper-resistant integrated circuits 100 and 200 can be mounted in a single chip package (such as a plastic carrier, with leads that are affixed to a motherboard or other higher level carrier) or in a multichip package (such as a ceramic carrier that has either or both surface interconnections or buried interconnections). In any case, tamper-resistant integrated circuits 100 and 200 can then be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
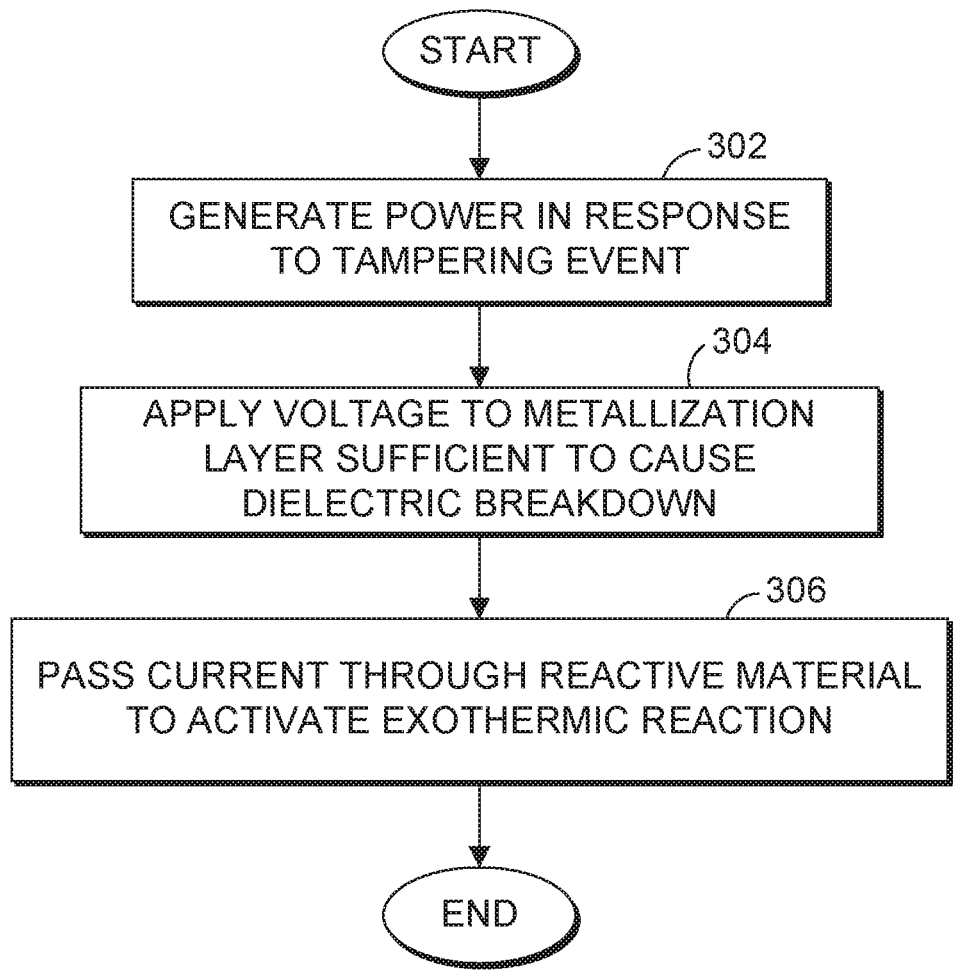
FIG. 3 is a flowchart depicting steps for activating a reaction in a tamper-resistant integrated circuit using electrical discharge, in accordance with an embodiment of the present invention.

FIG. 3 is a flowchart depicting steps for activating a reaction in a tamper-resistant integrated circuit using electrical discharge, in accordance with another embodiment of the present invention.

In step 302, power is generated in response to a tampering event. In this embodiment, a tampering event involves a breach of packaging or some other enclosure in which the tamper-resistant integrated circuit is disposed. For example, a tampering event might involve a user tearing, cutting, puncturing, or otherwise breaching packaging or a chassis which the tamper-resistant integrated circuit is disposed.

Power is generated in a manner that does not require the use of batteries or similar external power sources. In one embodiment, power is generated as static electricity from triboelectric charging (i.e., contact-induced charge separation) between portions of product packaging rubbing against each other in response to a tampering event. For example, product packaging can be comprised of one or more materials (e.g., glass, polyurethane foam, nylon, paper, silk, cotton, aluminum) that have a positive polarity of charge separation when touched with another object (i.e., give up electrons), and one or more materials (e.g., rubber, silver, polyester, vinyl, styrene, polyethylene, silicon) that tend to have a negative polarity of charge separation when touched with another object (i.e., attract electrons). Upon a breach of such product packaging, these different materials can rub together, transferring a charge that can be collected and transmitted (e.g., with one or more wires) to an electrical contact on a metallization layer of the tamper-resistant integrated circuit (e.g., metallization layer 116 or metallization layer 220) for use in activating the reactive material.

In another embodiment, power is generated using one or more photovoltaic cells. For example, one or more photovoltaic cells can be disposed within opaque product packaging. Upon a breach of such product packaging, the photovoltaic cells are exposed to light, generating power that can be transmitted (e.g., with one or more wires) to an electrical contact on a metallization layer of the tamper-resistant integrated circuit (e.g., metallization layer 116 or metallization layer 220) for use in activating the reactive material.

In this embodiment, the power generated in step 302 is sufficiently large such that voltage applied to the metallization layer of the tamper-resistant integrated circuit (e.g., metallization layer 116 or metallization layer 220) causes dielectric breakdown (e.g., of dielectric barrier layer 114 or of gases or vacuum within gap 218) and a discharge of current through the reactive material (e.g., reactive material 108 or reactive material 208) sufficient to activate the reactive material. Preferably, the power generated in step 302 is within a range of 10 nanowatts to 10 microwatts.

In step 304, voltage is applied to a metallization layer of the tamper-resistant integrated circuit sufficient to cause dielectric breakdown. In tamper-resistant integrated circuit 100, metallization 116 includes a contact electrically coupled to a metal interconnect in via 112, such that voltage applied to metallization 116 is applied to dielectric barrier layer 114, causing dielectric breakdown of barrier layer 114. In tamper-resistant integrated circuit 200, metallization 220 includes a contact electrically coupled to a metal interconnect deposited over diblock copolymer layer 216 above gap 218, such that voltage applied to metallization 220 is applied to diblock copolymer layer 216 above gap 218, causing dielectric breakdown within gap 218.

In step 306, current is passed through reactive material in the tamper-resistant integrated circuit to activate an exothermic reaction of the reactive material. In tamper-resistant integrated circuit 100, after dielectric breakdown of barrier layer 114, current is passed through reactive material 108 and metallization in semiconductor build 102 (i.e., to complete the circuit). In tamper-resistant integrated circuit 200, after dielectric breakdown within gap 218 (e.g., dielectric breakdown of air, other gases, or vacuum within gap 218), current arcs across gap 218 and discharges into reactive material 208 and metallization in semiconductor build 202 (i.e., to complete the circuit). In each case, reactive materials 108 and 208 undergo exothermic reaction that generates a sufficient amount of energy to erase and/or destroy semiconductor devices located in semiconductor builds 102 and 202, respectively.

Figure 4A:
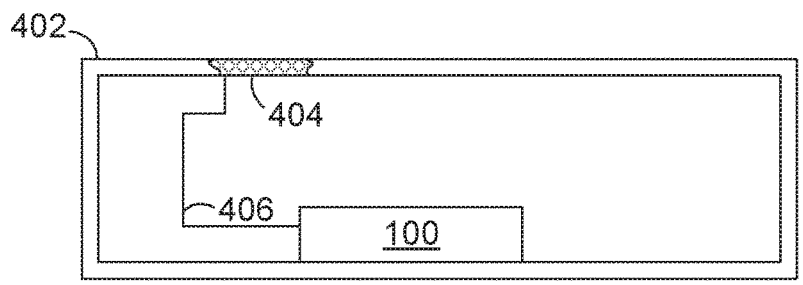
FIGS. 4A and 4B illustrate tamper-resistant packaging of a tamper-resistant integrated circuit, in accordance with an embodiment of the present invention.
Figure 4B:
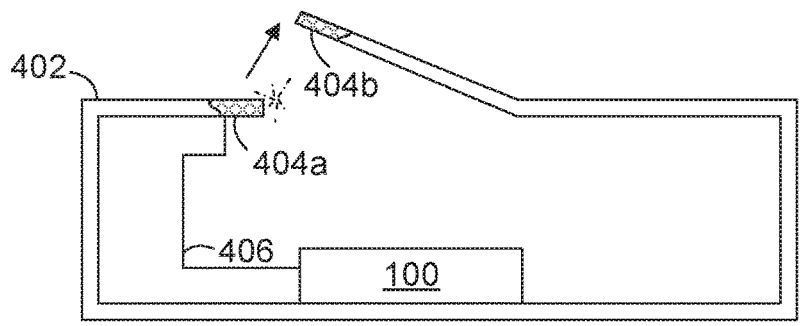

FIGS. 4A and 4B illustrate tamper-resistant packaging of a tamper-resistant integrated circuit 100, in accordance with an embodiment of the present invention. Packaging 402 represents generally any packaging or enclosure (e.g., flexible or rigid) in which tamper-resistant integrated circuit 100 is enclosed. The dimensions of packaging 402 shown in FIGS. 4A and 4B are only illustrative; packaging 402 can have any desired dimensions to accommodate a particular application. The embodiment shown in FIGS. 4A and 4B can also be used with tamper-resistant integrated circuit 200.

Packaging 402 comprises material 404 that generates static electricity from triboelectric charging when portions of material 404 are rubbed against each other in response to a tampering event. As previously discussed, for example, material 404 comprises one or more materials (e.g., glass, polyurethane foam, nylon, paper, silk, cotton, aluminum) that have a positive polarity of charge separation when touched with another object (i.e., give up electrons), and one or more materials (e.g., rubber, silver, polyester, vinyl, styrene, polyethylene, silicon) that have a negative polarity of charge separation when touched with another object (i.e., attract electrons).

In this embodiment, FIG. 4A shows a portion of material 404 being exposed for illustrative purposes; however, material 404 is disposed throughout packaging 402 (e.g., embedded within packaging 402), such that power can be generated in response to a breach along any portion of packaging 402. In other embodiments, material 404 can be strategically located in only certain regions of packaging 402. In yet other embodiments, material 404 can be disposed externally of packaging 402. For example, material 404 can be disposed as a separate layer, or as a self-contained unit coupled to packaging 402.

As shown in FIG. 4B, upon a breach of packaging 402 (e.g., a tampering event in which packaging 402 is cut, punctured, or ripped open), portions 404a and 404b of material 404 rub against each other, transferring a charge that is collected and transmitted via wire 406 to an electrical contact on metallization layer 116 of tamper-resistant integrated circuit 100 to activate reactive material 108, the exothermic reaction of which erases and/or destroys one or more semiconductor devices on tamper-resistant integrated circuit 100.

Figure 5A:
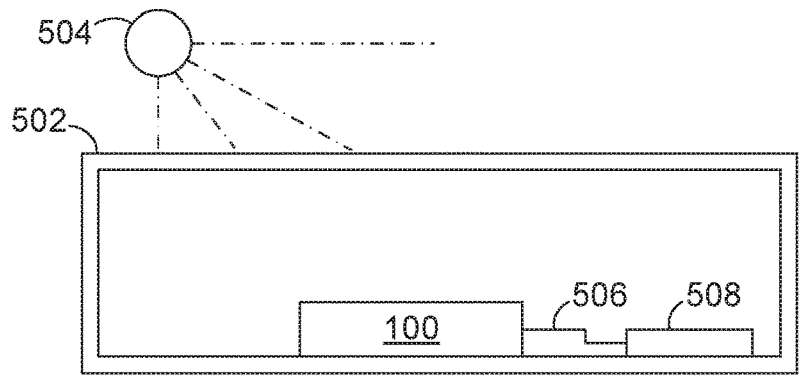
FIGS. 5A and 5B illustrate tamper-resistant packaging of a tamper-resistant integrated circuit, in accordance with another embodiment of the present invention.
Figure 5B:
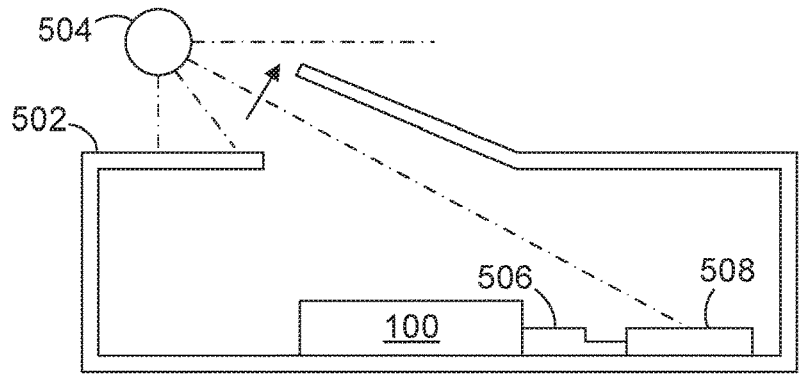

FIGS. 5A and 5B illustrate tamper-resistant packaging of tamper-resistant integrated circuit 100, in accordance with another embodiment of the present invention. Again, packaging 502 represents any packaging or enclosure in which tamper-resistant integrated circuit 100 is enclosed. The dimensions of packaging 502 shown in FIGS. 5A and 5B are only illustrative; packaging 502 can have any desired dimensions to accommodate a particular application. The embodiment shown in FIGS. 5A and 5B can also be used with tamper-resistant integrated circuit 200.

As shown in FIG. 5A, packaging 502 material blocks transmission of light from light source 504 to one or more photovoltaic cells 508 enclosed by packaging 502. Packaging 502 need not be comprised of materials intended to generate static electricity from triboelectric charging. Photovoltaic cells 508 can be implemented with any known photovoltaic technology capable of producing a requisite amount of power to activate reactive material 108 within tamper-resistant integrated circuit 100 when exposed to light source 504. Photovoltaic cells 508 can be strategically placed throughout the interior of packaging 502 to maximize exposure of photovoltaic cells 508 to light that enters the interior of packaging 502 in the event of a tampering event. Light source 504 may be any source of natural light (e.g., the sun), artificial light (i.e., lamps), and combinations thereof.

As shown in FIG. 5B, upon a breach of packaging 502 (e.g., a tampering event in which packaging 502 is cut, punctured, or ripped open), light generated by light source 504 enters the interior of packaging 502 and strikes photovoltaic cells 508. Photovoltaic cells 508 then generate a charge that is transmitted via wire 506 to an electrical contact on metallization layer 116 of tamper-resistant integrated circuit 100 to activate reactive material 108, the exothermic reaction of which erases and/or destroys one or more semiconductor devices on tamper-resistant integrated circuit 100.

In another embodiment, a combination of photovoltaic cells 508 and material 404 can be used to ensure that reactive material 108 is activated in response to any of a variety of tampering events.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described several embodiments of the present invention (which are intended to be illustrative and not limiting), it is noted that modifications and variations may be made by persons skilled in the art in light of the above teachings. It is, therefore, to be understood that changes may be made in the particular embodiments disclosed which are within the scope of the invention as outlined by the appended claims.

What is claimed is:

1. A method comprising:
   providing an integrated circuit comprising:
      a semiconductor build;
      reactive material deposited into a trench in the semiconductor build; and
      metallization disposed atop the reactive material, wherein at least a portion of the metallization is configured to carry electrical current to the reactive material; and
   activating an exothermic reaction of the reactive material using the current passed through the reactive material.

2. The method of claim 1, wherein the reactive material comprises a plurality of alternating layers of metals that are configured to undergo exothermic reaction upon being activated by the current.

3. The method of claim 1, wherein the integrated circuit further comprises:
   a first dielectric layer beneath the reactive material; and
   a second dielectric layer atop the reactive material and beneath the metallization.

4. The method of claim 1, wherein the integrated circuit further comprises a gap that contains i) one or more gases or ii) a vacuum, wherein the gap is atop the reactive layer and beneath the metallization.

5. The method of claim 1, further comprising:
using energy generated by the exothermic reaction of the reactive material to erase or destroy a semiconductor device in the semiconductor build.

6. The method of claim 1, further comprising:
responsive to a tampering event, generating power greater than or equal to 10 nanowatts and less than or equal to 10 microwatts.

7. The method of claim 1, wherein the integrated circuit further comprises:
packaging enclosing the semiconductor build, wherein the packaging comprises materials configured to generate a charge from triboelectric charging in response to a tampering event; and
one or more wires electrically coupled to the packaging and the metallization disposed atop the barrier, wherein the one or more wires are configured to transmit the generated charge to the metallization disposed atop the barrier.

8. The method of claim 7, further comprising:
responsive to a tampering event, using the packaging to generate power greater than or equal to 10 nanowatts and less than or equal to 10 microwatts from triboelectric charging.

9. The method of claim 1, wherein the integrated circuit further comprises:
packaging enclosing the semiconductor build and one or more photovoltaic cells, wherein the one or more photovoltaic cells are configured to generate a charge in response to a tampering event in which light enters the packaging and strikes one or more photovoltaic cells; and
one or more wires electrically coupled to the one or more photovoltaic cells and the metallization disposed atop the barrier, wherein the one or more wires are configured to transmit the generated charge to the metallization disposed atop the barrier.

10. The method of claim 9, further comprising:
responsive to a tampering event, using the one or more photovoltaic cells to generate power greater than or equal to 10 nanowatts and less than or equal to 10 microwatts.

* * * * *